United States Patent [19]
Foster et al.

[11] Patent Number: 5,610,106
[45] Date of Patent: Mar. 11, 1997

[54] PLASMA ENHANCED CHEMICAL VAPOR DEPOSITION OF TITANIUM NITRIDE USING AMMONIA

[75] Inventors: Robert F. Foster, Phoenix; Joseph T. Hillman, Scottsdale; Rikhit Arora, Mesa, all of Ariz.

[73] Assignees: Sony Corporation, Tokyo, Japan; Materials Research Corporation, Park Ridge, N.J.

[21] Appl. No.: 401,859

[22] Filed: Mar. 10, 1995

[51] Int. Cl.$^6$ .......................... H01L 21/465; H01L 21/441
[52] U.S. Cl. .................. 437/245; 427/255.1; 427/126.1; 437/192; 437/190
[58] Field of Search ................................. 437/245, 192, 437/190; 427/255.1, 126.1

[56] References Cited

U.S. PATENT DOCUMENTS

| | | | |
|---|---|---|---|
| 4,792,378 | 12/1988 | Rose et al. ............................ | 156/643 |
| 4,798,165 | 1/1989 | deBoer et al. ........................ | 118/715 |
| 4,897,709 | 1/1990 | Yokoyama et al. . | |
| 5,052,339 | 10/1991 | Vakerlis et al. ...................... | 118/723 |
| 5,192,370 | 3/1993 | Oda et al. ............................ | 118/723 |
| 5,246,881 | 9/1993 | Sandhu et al. ....................... | 437/192 |
| 5,268,034 | 12/1993 | Vukelic ................................. | 118/725 |
| 5,296,404 | 3/1994 | Akahori et al. ...................... | 437/192 |
| 5,342,652 | 8/1994 | Foster et al. ......................... | 427/253 |
| 5,356,476 | 10/1994 | Foster et al. ......................... | 118/720 |
| 5,370,739 | 12/1994 | Foster et al. ......................... | 118/725 |
| 5,378,501 | 1/1995 | Foster et al. ......................... | 427/255.2 |
| 5,416,045 | 5/1995 | Kauffman et al. ................... | 437/174 |
| 5,433,787 | 7/1995 | Suzuki et al. ....................... | 118/723 ME |
| 5,434,110 | 7/1995 | Foster et al. ......................... | 437/245 |
| 5,443,647 | 8/1995 | Aucoin et al. ....................... | 118/723 |

FOREIGN PATENT DOCUMENTS 4012901  12/1990  Germany .

OTHER PUBLICATIONS

M. R. Hilton et al. "Composition, Morphology, and Mechanical Properties of Plasma-Assisted CVD TiN Films on M2 Tool Steel", *Thin Solid Films* vol. 139 (1986) pp. 247–260.

*Primary Examiner*—George Fourson
*Assistant Examiner*—C. Everhart
*Attorney, Agent, or Firm*—Wood, Herron & Evans, P.L.L.

[57] ABSTRACT

A method of forming a titanium nitride film onto a semiconductor substrate includes forming a plasma of a reactant gas mixture. The reactant gas mixture includes titanium tetrachloride, ammonia and nitrogen. The ratio of nitrogen to ammonia is established at about 10:1 to about 10,000:1 and the partial pressure of titanium tetrachloride is established to ensure formation of titanium nitride. The plasma is contacted to a substrate heated to a temperature of 400° C. to about 500° C. This provides a high purity titanium nitride film with excellent conformality at temperatures which will not interfere with integrated circuits having previously-deposited aluminum members.

8 Claims, 1 Drawing Sheet

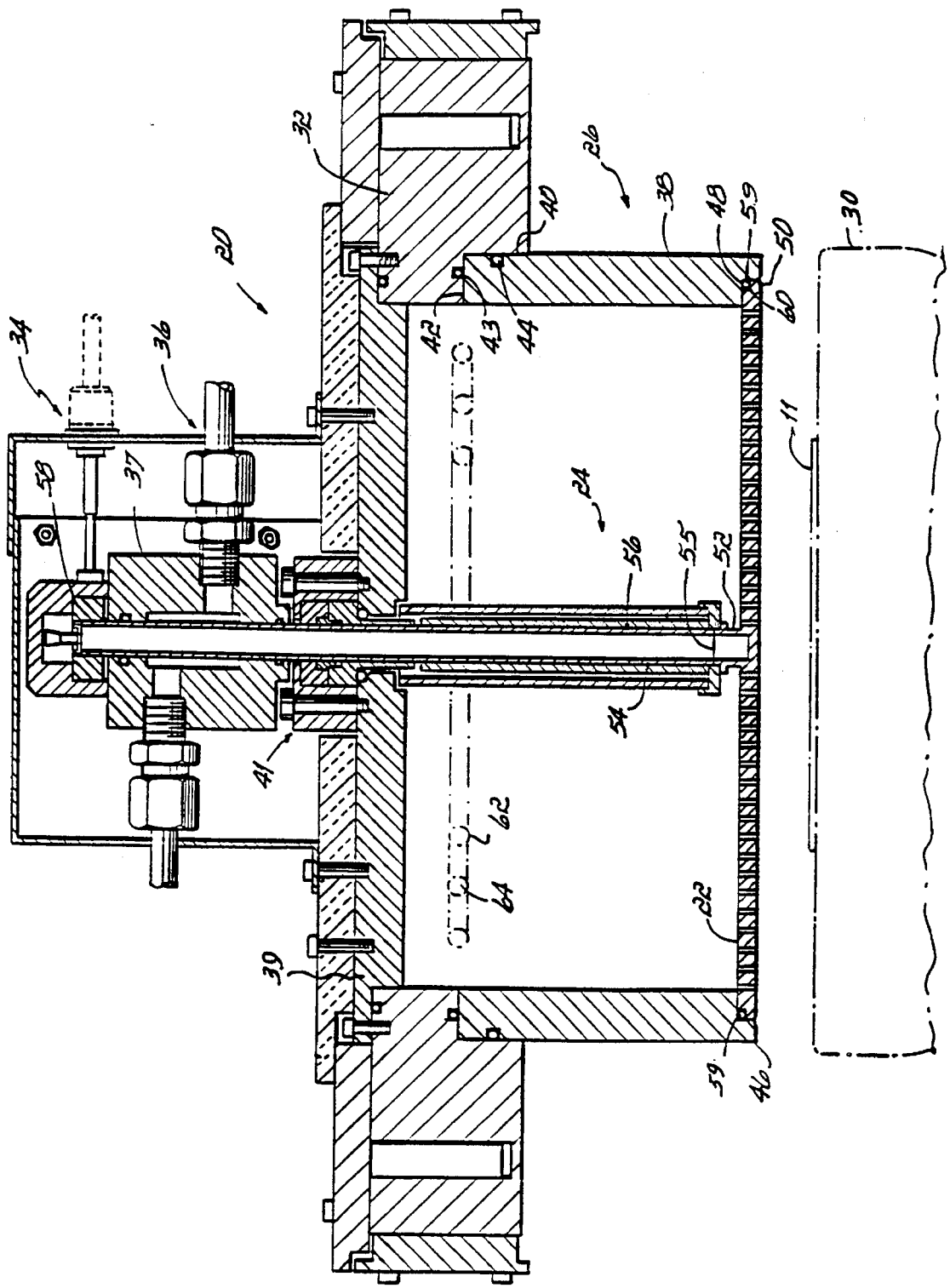

PLASMA ENHANCED CHEMICAL VAPOR DEPOSITION OF TITANIUM NITRIDE USING AMMONIA

BACKGROUND OF THE INVENTION

Titanium nitride is used in a variety of applications for integrated circuit fabrication. It has been used for an adhesion layer for tungsten film, as a local interconnect and as a diffusion barrier.

As an adhesion layer, titanium nitride offers advantages in applications where tungsten is used for contact hole and via filling. The process is normally started by depositing a thin layer of a material that acts to improve adhesion between the tungsten and underlying dielectric. Since tungsten adheres poorly to dielectric materials, a material must be used which adheres well to the dielectric and then adheres well to the tungsten. Titanium nitride is such a material and provides several advantageous properties such as very low resistivity and a resistance to the chemistries used to etch tungsten, as well as exhibiting good adhesion to both dielectric and tungsten films.

Titanium nitride can also be used as a barrier layer because is serves as an impermeable barrier to silicon. It also has an activation energy higher than other materials. For example, the activation energy for copper diffusion into titanium nitride is reported to be 4.3 electron volts, while the activation energy from copper into most metals is on the order of 1 to 2 electron volts.

Typically, titanium nitride is formed by vapor evaporation of titanium in a nitrogen ambient, by reactively sputtering titanium in a nitrogen/argon mixture, by sputtering titanium nitride from a target in an argon environment, by depositing titanium and then converting it to titanium nitride in a subsequent nitridization step, or by the thermal chemical vapor deposition reaction employing titanium tetrachloride and ammonia, or metal-organic precursors.

There are limitations to many of these techniques. In the case of sputtered films, poor conformality is a problem at high aspect ratio vias. In the case of thermal chemical vapor deposition films, the conformality over high aspect ratio geometries is excellent. However, the high deposition temperatures employed make chemical vapor deposition of titanium nitride impractical for use in multi-level metalization schemes. Temperatures greater than 400° C. cause unwanted thermal stress to aluminum layers resulting in hillock formation and damage to the inter-metal dielectric layers.

SUMMARY OF THE INVENTION

Accordingly, it is an object of the present invention to provide a low-temperature process employing a plasma-enhanced chemical vapor deposition technique which results in a film with a deposition temperature low enough that it does not damage aluminum, yet retains good conformality associated with thermal chemical vapor deposition. These objects are achieved by employing the plasma-enhanced chemical vapor deposition of titanium nitride employing a plasma formed from reacting gases including titanium tetrachloride, nitrogen and ammonia. By establishing the plasma at the surface of the substrate being coated, a very uniform film with low resistivity and low levels of impurities such as chlorine are achieved at relatively low temperatures—less than 500° C.

Further, by controlling the partial pressure of the reactants, the properties of the formed titanium nitride film are significantly improved. The objects and advantages of the present invention will be further appreciated in light of the following detailed description and drawing which:

BRIEF DESCRIPTION OF THE FIGURE

The FIGURE is a cross-sectional diagrammatic view of a reactor for use in the process of the present invention.

DETAILED DESCRIPTION

According to the present invention, titanium nitride is formed by plasma-enhanced chemical vapor deposition of titanium nitride formed by reacting titanium tetrachloride, ammonia and a diluent gas. An apparatus suitable for use in practicing the present invention is disclosed in two co-pending applications entitled "Method and Apparatus for Producing Thin Films by Low Temperature Plasma-Enhanced Chemical Vapor Deposition Using A Rotating Susceptor Reactor"; Ser. Nos. 08/253,366 and 08/253,393, both filed Jun. 3, 1994 and the disclosures of which are hereby incorporated by reference.

The Figure shows a cross-sectional view of apparatus 20 suitable for plasma-enhanced chemical vapor deposition. Apparatus 20 includes an RF showerhead/electrode 22 biased by an RF feedline assembly 24. Plasma and reactant gases are pumped through a cylinder assembly 26 to a substrate 11 on susceptor 30. Apparatus 20 includes a housing having a housing cover 32 and includes an RF supply assembly 34, a heat pipe assembly 36 with cooling jacket 37 and associated fluid supply lines and a gas distributor cover 39 with a sealing assembly 41. A cylinder 38 made of an insulating material such as quartz surrounds the RF feed line assembly 24.

Cylinder 38 is preferably formulated out of a high quality quartz such as Quartz T08-E, available from Hereaus Amersil. Quartz cylinder 38 is supported by a showerhead/electrode 22, made of a conductive metal such as Nickel-200. An annular bore 40 is formed within housing cover 32 to receive an upper end 42 of cylinder 38. O-rings 43, 44 at the interface between stepped bore 40 and cylinder 38 form a seal at the interface. At the lower end 46 of cylinder 38, an annular notch 48 in cylinder 38 receives a peripheral edge 50 of the showerhead/electrode 22. The notch 48 of cylinder 38 rests upon the peripheral edge 50 of showerhead/electrode 22. Showerhead/electrode 22 includes a stem 52 attached to RF line tubing 54, such as by a weld at 55, to form a unitary RF line 56. RF line 56 is frictionally held and supported at its top end by collar 58. The RF line, in turn, supports showerhead/electrode 22 above susceptor 30. Showerhead/electrode 22, in turn, supports the cylinder 38 within the cylinder assembly 26 by abutting against cylinder 38 at notch 48 and holding it in bore 40. The interface between showerhead/electrode peripheral edge 50 and cylinder notch 48 is sealed by a compressed O-ring 59 which is compressed between shelf 48 and a similar corresponding annular notch 60 formed in peripheral edge 50 of the showerhead/electrode 22. A plurality of gas halos or rings 62, 64 introduce reactant gases into cylinder 38.

Generally, the substrate 11 is spaced from about 0.25 to 3 inches from the showerhead/electrode 22. The distance should be such that active ions strike the substrate.

In general, reaction gases are introduced through rings 62 and 64. These gases pass through cylinder 38 and a plasma is generated as the gases pass through the showerhead/electrode 22. The plasma will strike the substrate 11.

This Apparatus is used to deposit titanium nitride over a variety of different materials or substrates. These substrates include, for example, silica, glass and thermal oxide. Further, the substrate can include various elements of integrated circuits previously deposited and/or etched onto the surface of the substrate such as vias, channels, conducting layers, resistors and others.

In depositing the titanium nitride film, a plasma of reactant gases is created using apparatus 20 at showerhead 22. The reactant gases include titanium tetrachloride, ammonia and a diluent. Although diluents such as hydrogen, helium and argon can be employed, nitrogen is preferred. These are combined together and introduced into cylinder 38.

Cylinder 38 is maintained at a pressure from about 0.5 to about 20 torr with about 5 torr being preferred. The substrate is maintained at a temperature of about 400° to about 500° C. with about 450° C. being preferred. The substrate is generally heated by providing heat from the support 30. The support itself is preferably rotated at about 100 rpm or more simply to provide for more even distribution. However, the substrate need not be rotated at all.

The concentration of the gases is controlled by flow rate. Generally, the titanium tetrachloride will be introduced at a flow rate of about 1 to about 40 sccm, with about 10 sccm being preferred. The partial pressure of the $TiCl_4$ must be sufficiently low to form TiN. If the $TiCl_4$ partial pressure becomes too high, a black powder is formed which is not TiN. When the total pressure is 5 torr, the partial pressure of $TiCl_4$ should be less than 0.02 torr, preferably 0.01 torr to 0.001 torr. At the lower pressures (i.e., 0.0001 torr), the reaction rate is significantly reduced and the step coverage can be unacceptable. As the total pressure increases from 5 torr, the partial pressure of $TiCl_4$ can be increased accordingly. For TiN to be useful, the film on the substrate should be adherent and continuous. Films of this nature are gold in color. The black powder that forms is nonadherent (it can be wiped off readily). Therefore, the upper limits of the partial pressure of $TiCl_4$ is that partial pressure at which a black powder begins to form on the substrate. This, of course, can vary depending on the total pressure. Generally, the molar ratio of ammonia to $TiCl_4$ will be from 2:1 (ammonia to $TiCl_4$) up to 100:1. At this higher rate, the reaction rate will be very low. Preferably, the ratio will be about 10:1.

Generally the ratio of diluent to ammonia will range from about 10:1 up to about 10,000:1. This ratio, however, does not significantly affect the deposition rate.

To demonstrate the present invention, titanium nitride was deposited under the following conditions:

| | |
|---|---|
| Susceptor Temperature | 467° C. |
| Wafer Temperature | 450° C. |
| Reactor Pressure | 5 torr |
| $TiCl_4$ Flow Rate | 10 sccm |
| Ammonia Flow Rate | 100 sccm |
| Nitrogen Flow Rate | 5,000 sccm |

In the process sequence, the RF plasma source was turned on after establishing the 5 torr reactor pressure with nitrogen/ammonia. Titanium tetrachloride flow was initiated 30 seconds after the plasma was ignited. RF power used in these runs was 500 watts. The film properties obtained with this process were:

| | |
|---|---|
| Deposition Rate | 120–150Å per minute |
| Titanium Nitride Resistivity | 103–148 micro ohm cm |
| Nitrogen to Titanium Ratio | 1.07 |
| Chlorine Content | 0.6 atomic percent |

The RBS technique used to conduct elemental analysis did not detect any oxygen in the bulk of the film. Step coverage was measured to be 80%.

Additional films were deposited in under the following conditions:

| RUN | | 1 | 2 | 3 | 4 | 5 | 6 | 7 | 8 |
|---|---|---|---|---|---|---|---|---|---|
| DEPOSITION CONDITIONS: | | | | | | | | | |
| $TiCl_4$ Flow Rate | sccm | 10 | 10 | 10 | 10 | 10 | 10 | 10 | 10 |
| $NH_3$ Flow Rate | sccm | 100 | 100 | 100 | 100 | 200 | 300 | 100 | 100 |
| $N_2$ Flow Rate | sccm | 5000 | 5000 | 5000 | 5000 | 5000 | 5000 | 5000 | 5000 |
| RF Power | watts | 500 | 500 | 500 | 500 | 500 | 500 | 500 | 500 |
| Pressure | torr | 5 | 5 | 5 | 5 | 5 | 5 | 5 | 5 |
| Deposition Time | seconds | 120 | 120 | 120 | 120 | 120 | 120 | 300 | 300 |
| Rotation Rate | rpm | 100 | 100 | 100 | 100 | 100 | 100 | 100 | 100 |
| Susceptor Temp. | °C. | 467 | 467 | 467 | 467 | 467 | 467 | 467 | 467 |
| Wafer Temp. | °C. | 450 | 450 | 450 | 450 | 450 | 450 | 450 | 450 |
| ANNEAL CONDITIONS: | | | | | | | | | |
| $NH_3$ Flow Rate | sccm | 5000 | 5000 | 5000 | 5000 | 5000 | 5000 | 5000 | 5000 |
| RF Power | watts | 750 | 750 | 750 | 750 | 750 | 750 | 750 | 750 |
| Pressure | torr | 5 | 5 | 5 | 5 | 5 | 5 | 5 | 5 |
| Anneal Time | seconds | 120 | 120 | 120 | 120 | 120 | 120 | 120 | 120 |
| Rotation Rate | rpm | 100 | 100 | 100 | 100 | 100 | 100 | 100 | 100 |
| FILM PROPERTIES: | | | | | | | | | |
| Thickness | Å | 245 | 347 | 305 | 293 | 283 | 277 | 521 | 467 |
| Deposition Rate | Å/minute | 122.5 | 173.5 | 152.5 | 146.5 | 141.5 | 138.5 | 104.2 | 93.4 |
| Resistivity | μΩcm | 106 | 148 | 131 | 125 | 182 | 169 | 103 | |
| Rs Unif | % | 8.87 | 20.91 | 20.29 | 19.56 | 27.77 | 23.08 | 5.96 | |
| Substrate | | 5% Wf Dia. | 10k THOX | 10k THOX | 10k THOX | 10k THOX | 10k THOX | 10k THOX | Patterned |

Thus, using the method of the present invention, a very high quality titanium nitride film is deposited. This film has the desired characteristics of a chemical vapor deposited film, i.e., excellent conformality, and, at the same time, is deposited at a relatively low temperature. Further, the deposited film has relatively low resistivity and the impurity content is very low, particularly the chlorine content and the oxygen content. Thus, the present invention accomplishes the goal of providing a very high quality titanium nitride film at relatively low temperatures which would enable it to be used to deposit titanium nitride over a substrate having aluminum without damaging the aluminum film.

This has been a description of the present invention, along with the preferred method of practicing the present invention. However, the invention itself should be defined only by the appended claims wherein we claim:

1. A method of depositing titanium nitride onto a substrate by chemical vapor deposition comprising establishing a plasma of reacting gases wherein said reacting gases are titanium tetrachloride and ammonia, and wherein said plasma is created at a showerhead spaced from said substrate at a distance of about 0.25 to about 3 inches;
    contacting said substrate with said plasma wherein titanium nitride is deposited on said substrate.

2. The method claims in claim 1 further comprising combining a diluent with said reacting gases.

3. The method claimed in claim 1 wherein titanium tetrachloride is present at a partial pressure effective to form TiN and greater than 0.001 torr.

4. The method claimed in claim 3 wherein said plasma is established in an atmosphere having a pressure of 0.5 to 20 torr.

5. The method claimed in claim 3 wherein said substrate is heated from a temperature of about 400° C. up to about 500° C.

6. The method claimed in claim 2 wherein said diluent is nitrogen and a ratio of nitrogen to ammonia is established at from about 10:1 to about 10,000:1 on a molar basis.

7. The method claimed in claim 3 wherein said partial pressure of titanium tetrachloride is from greater than 0.001 torr to 0.01 torr.

8. A method of depositing titanium nitride onto a substrate by chemical vapor deposition comprising establishing a plasma of a reactant gas mixture wherein said reactant gas mixture is a mixture of titanium tetrachloride, ammonia and nitrogen, wherein the ratio of ammonia to titanium tetrachloride is from about 2:1 to about 100:1, wherein said plasma is created at a showerhead spaced from said substrate at a distance of about 0.25 to about 3 inches, and contacting said substrate with said plasma at a pressure of 0.5 to 20 torr, wherein said substrate is heated to a temperature of about 400° C. to about 500° C., whereby titanium nitride is deposited on said substrate.

* * * * *